US006207338B1

(12) United States Patent
Ezenyilimba et al.

(10) Patent No.: US 6,207,338 B1

(45) **Date of Patent: *Mar. 27, 2001**

(54) TONER PARTICLES OF CONTROLLED MORPHOLOGY

(75) Inventors: Matthew C. Ezenyilimba, Rochester; Michael T. Regan, Fairport, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/265,750

(22) Filed: Mar. 10, 1999

(51) Int. Cl.[7] ...................................................... G03F 9/087

(52) U.S. Cl. ........................... 430/137; 430/109; 430/110

(58) Field of Search .................................... 430/137, 109, 430/110, 111; 524/780, 786, 714; 523/333, 339

(56) References Cited

U.S. PATENT DOCUMENTS

| | | | | |
|---|---|---|---|---|
| 3,893,935 | | 7/1975 | Jadwin et al. | 430/110 |
| 4,079,014 | | 3/1978 | Burness et al. | 430/110 |
| 4,323,634 | | 4/1982 | Jadwin | 430/110 |
| 4,833,060 | | 5/1989 | Nair et al. | 430/137 |
| 5,059,580 | * | 10/1991 | Shibata et al. | 503/227 |
| 5,283,151 | | 2/1994 | Santilli | 430/137 |
| 5,620,826 | * | 4/1997 | Tavernier et al. | 430/137 |
| 5,968,702 | * | 10/1999 | Ezenyilimba et al. | 430/111 |

FOREIGN PATENT DOCUMENTS 1 420 839 1/1976 (GB) .

* cited by examiner

*Primary Examiner*—Janis L. Dote
(74) *Attorney, Agent, or Firm*—Doreen M. Wells

(57) ABSTRACT

A method for the preparation of electrostatographic toner comprising the steps of:

a) dissolving a polymer material in an organic solvent to form an organic phase;
b) dispersing the organic phase in an aqueous phase comprising a salt selected from aluminum salt and gallium salt and a particulate stabilizer to form a dispersion and homogenizing the resultant dispersion;
c) evaporating the organic solvent and recovering a resultant product; and
d) washing and drying the resultant product.

15 Claims, No Drawings

TONER PARTICLES OF CONTROLLED MORPHOLOGY

FIELD OF THE INVENTION

This invention relates to a method for the preparation of polymeric powders suitable for use as electrostatographic toner, and more particularly, to a method for the preparation of toner particles of controlled shape in which soluble aluminum or gallium salts are employed for controlling morphology of the toner particles.

BACKGROUND OF THE INVENTION

Electrostatic toner polymer particles can be prepared by a process frequently referred to as "limited coalescence". In this process, polymer particles having a narrow size distribution are obtained by forming a solution of a polymer in a solvent that is immiscible with water, dispersing the solution so formed in an aqueous medium containing a solid colloidal stabilizer and removing the solvent by evaporation. The resultant particles are then isolated, washed and dried.

In the practice of this technique, toner particles are prepared from any type of polymer that is soluble in a solvent that is immiscible with water. Thus, the size and size distribution of the resulting particles can be predetermined and controlled by the relative quantities of the particular polymer employed, the solvent, the quantity and size of the water insoluble solid particulate suspension stabilizer, typically silica or latex, and the size to which the solvent-polymer droplets are reduced by agitation.

Limited coalescence techniques of this type have been described in numerous patents pertaining to the preparation of electrostatic toner particles because such techniques typically result in the formation of toner particles having a substantially uniform size distribution. Representative limited coalescence processes employed in toner preparation are described in U.S. Pat. Nos. 4,833,060 and 4,965,131 to Nair et al.

U.S. Pat. No. 5,283,151 is representative of earlier work in this field and describes the use of carnauba wax to achieve similar toner morphology. The method comprises the steps of dissolving camauba wax in ethyl acetate heated to a temperature of at least 75° C. and cooling the solution, so resulting in the precipitation of the wax in the form of very fine needles a few microns in length; recovering the wax needles and mixing them with a polymer material, a solvent and optionally a pigment and a charge control agent to form an organic phase; dispersing the organic phase in an aqueous phase comprising a particulate stabilizer and homogenizing the mixture; evaporating the solvent and washing and drying the resultant product.

Unfortunately, this technique requires the use of elevated temperature to dissolve the wax in the solvent and cooling the solution to precipitate the wax. The wax does not stay in solution of ethyl acetate at ambient temperature and as a result it is very difficult to scale up using this methodology.

The shapes of the toner particles have a bearing on the electrostatic toner transfer and cleaning properties. Thus, for example, the transfer and cleaning efficiency of toner particles have been found to improve as the sphericity of the particles are reduced. Thus far, workers in the art have long sought to modify the shape of the evaporative limited coalescence type toner particles by means other than the choice of pigment, binder, or charge agent. The shape of the toner particles are modified to enhance the cleaning and transfer properties of the toner.

SUMMARY OF THE INVENTION

In accordance with the present invention, the prior art limitations are effectively obviated by a novel process in which aluminum or gallium salts are introduced into the aqueous phase of the limited coalescence process in a limited amount. The use of this limited amount of aluminum or gallium salt results in the formation of non-spherical toner particles after the solvent is removed. The toner morphology is controlled independently of the toner composition (resin, binder matrix, pigment, charge control agent, etc.). The degree of nonsphericity is directly related to the salt concentration.

Thus, viewed from one aspect, the present invention is directed to a method for the preparation of electrostatographic toner comprising the steps of:

a) dissolving a polymer material and optionally a pigment and a charge control agent in an organic solvent to form an organic phase;

b) dispersing the organic phase in an aqueous phase comprising a salt selected from the group consisting of aluminum salt and gallium salt and a particulate stabilizer to form a dispersion and homogenizing the resultant dispersion;

c) evaporating the organic solvent and recovering a resultant product; and d) washing and drying the resultant product.

Viewed from another aspect, the present invention is directed to a process for preparing electrophotographic toner by dispersing an organic phase in an aqueous phase to yield a layer of particulate suspension stabilizer on the surface of the polymer. The improvement in the process comprises adding the salt, particulate stabilizer and promoter to the aqueous phase in the aforementioned limited coalescence process.

It is an advantage of the present invention that elevated temperatures are not needed. It is also an advantage that aluminum and gallium salts are water soluble and so it is relatively easy to scale up production.

These and other features and advantages of the present invention will be better understood taken in conjunction with the following detailed description and claims.

DETAILED DESCRIPTION OF THE INVENTION

In accordance with the present invention, a pigment dispersion is prepared by conventional techniques as, for example, by media milling, melt dispersion and the like. The pigment dispersion, polymer material, a solvent and optionally a charge control agent are combined to form an organic phase in which the pigment concentration ranges from about 4% to 20%, by weight, based upon the total weight of solids. The pigment to aluminum or gallium salts ratio ranges from about 1:0.5 to 1:0.06 by weight. The charge control agent is employed in an amount ranging from 0 to 10 parts per hundred by weight, based on the total weight of solids, with a preferred range from 0.2 to 3.0 parts per hundred. This mixture is permitted to stir overnight and then dispersed in an aqueous phase comprising a particulate stabilizer and optionally a promoter.

The solvents chosen for use in the organic phase steps may be selected from among any of the well-known solvents capable of dissolving polymers. Typical of the solvents chosen for this purpose are chloromethane, dichloromethane, ethyl acetate, vinyl chloride, methylethylketone, n-propyl acetate, iso-propyl acetate, trichloromethane, carbon tetrachloride, ethylene chloride, trichloroethane, toluene, xylene, cyclohexanone, 2-nitropropane and the like.

The particulate stabilizer selected for use herein may be selected from among highly cross-linked polymeric latex materials of the type described in U.S. Pat. No. 4,965,131 to Nair et al., or silicon dioxide. Silicon dioxide is preferred. It is generally used in an amount ranging from 1 to 15 parts by weight based on 100 parts by weight of the total solids of the toner employed. The size and concentration of these stabilizers control and predetermine the size of the final toner particles. In other words, the smaller the size and/or the higher the concentration of such particles, the smaller the size of the final toner particles.

Any suitable promoter that is water soluble and affects the hydrophilic/hydrophobic balance of the solid dispersing agent in the aqueous solution may be employed in order to drive the solid dispersing agent, that is, the particulate stabilizer, to the polymer/solvent droplet-water interface. Typical of such promoters are sulfonated polystyrenes, alginates, carboxy methylcellulose, tetramethyl ammonium hydroxide or chloride, diethylaminoethylmethacrylate, water soluble complex resinous amine condensation products of ethylene oxide, urea and formaldehyde and polyethyleneimine. Also effective for this purpose are gelatin, casein, albumin, gluten and the like or non-ionic materials such as methoxycellulose. The promoter is generally used in an amount from about 0.2 to about 0.6 parts per 100 parts, by weight, of aqueous solution.

Various additives generally present in electrostatograhic toner may be added to the polymer prior to dissolution in the solvent or in the dissolution step itself, such as charge control agents, waxes and lubricants. Suitable charge control agents are disclosed, for example, in U.S. Pat. Nos. 3,893,935 and 4,323,634 to Jadwin et al. and U.S. Pat. No. 4,079,014 to Burness et al.; and British Patent No. 1,420,839 to Eastman Kodak. Charge control agents are generally employed in small quantities such as from about 0 to 10 parts per hundred by weight based upon the weight of the total solids content (weight of the toner) and preferably from about 0.2 to about 3.0 parts per hundred.

The resultant mixture is then subjected to mixing and homogenization. In this process, the particulate stabilizer forms an interface between the organic globules in the organic phase. Due to the high surface area associated with small particles, the coverage by the particulate stabilizer is not complete. Coalescence continues until the surface is completely covered by particulate stabilizer. Thereafter, no further growth of the particles occurs. Accordingly, the amount of the particulate stabilizer is inversely proportional to the size of the toner obtained. The relationship between the aqueous phase and the organic phase, by volume may range from 1:1 to approximately 9:1. This indicates that the organic phase is typically present in an amount from about 10% to 50% of the total homogenized volume.

Following the homogenization treatment, the solvent present is evaporated and the resultant product washed and dried.

As indicated, the present invention is applicable to the preparation of polymeric toner particles from any type of polymer that is capable of being dissolved in a solvent that is immiscible with water and includes compositions such as, for example, olefin homopolymers and copolymers, such as, polyethylene, polypropylene, polyisobutylene and polyisopentylene; polytrifluoroolefins; polytetrafluoroethylene and polytrifluorochloroethylene; polyamides, such as polyhexamethylene adipamide, polyhexamethylene sebacamide, and polycaprolactam; acrylic resins, such as polymethylmethacrylate, polymethylacrylate, polyethyhnethacrylate and styrene-methylmethacrylate; ethylene-methylacrylate copolymers, ethylene-ethyl acrylate copolymers, ethylene-ethyl methacrylate copolymers, polystyrene and copolymers of styrene with unsaturated monomers, cellulose derivatives, polyesters, polyvinyl resins and ethylene-allyl alcohol copolymers and the like.

Pigments suitable for use in the practice of the present invention should be capable of being dispersed in the polymer, insoluble in water and yield strong permanent color. Typical of such pigments are the organic pigments such as phthalocyanines, lithols and the like and inorganic pigments such as $TiO_2$, carbon black and the like. Typical of the phthalocyanine pigments are copper phthalocyanine, a mono-chlor copper phthalocyanine, and hexadecachlor copper phthalocyanine. Other organic pigments suitable for use herein include anthraquinone vat pigments such as vat yellow 6GLCL1127, quinone yellow 18-1, indanthrone CL1106, pyranthrone CL1096, brominated pyranthrones such as dibromopyranthrone, vat brilliant orange RK, anthramide brown CL1151, dibenzanthrone green CL1101, flavanthrone yellow CL1118; azo pigments such as toluidine red C169 and hansa yellow; and metallized pigments such as azo yellow and permanent red. The carbon black may be any of the known types such as channel black, furnace black, acetylene black, thermal black, lamp black and aniline black. The pigments are employed in an amount sufficient to give a content thereof in the toner from about 1% to 40%, by weight, based upon the weight of the toner, and preferably within the range of 4% to 20%, by weight.

The aluminum and gallium salts chosen for use in the practice of the present invention are commonly available from commercial sources.

The salts found to be particularly useful for this purpose are Aluminum Acetate, Aluminum Acetylacetonate, and Gallium Acetylacetonate and is employed in an amount ranging from 0.1% to 10%, by weight, based upon the weight of the final toner.

The invention will be more fully understood by reference to the following exemplary embodiment, which is set forth solely for purposes of exposition and is not to be construed as limiting. Unless otherwise indicated all percentages are by weight.

COMPARATIVE EXAMPLE I

A media milled dispersion of HOSTAPERM pink pigment (manufactured by Hoechst Celanese) was prepared from a mixture of 91.0 g of the HOSTAPERM pink pigment, 9.0 g of commercially available styrene butylacrylate polymer (PICCOTONER 1221) in 670.0 g of ethyl acetate (13.0% solids of mixture). To 14.8 g of the above media milled dispersion were then added 23.1 g of KAO C polyester binder and 45.5 g of ethyl acetate. This mixture was comprised of 7.0% pigment and 93.0% binder and comprised the organic phase in the evaporative limited coalescence process. The organic phase was then mixed with an aqueous phase comprising 85 ml of pH4 buffer containing 9.0 g of NALCO® 1060 colloidal silica and 1.96 ml of 10% poly (adipic acid-comethylaminoethanol). This mixture was then subjected to very high shear using a POLYTRON mixer sold by Brinkman followed by a MICROFLUIDIZER mixer. Upon exiting, the solvent was removed from the particles so formed by stirring overnight at room temperature in an open container. These particles were washed with 0.1N potassium hydroxide solution to remove the silica followed by water and dried. The toner particles were of the order of 6.5μ volume average and entirely spherical.

COMPARATIVE EXAMPLE II

The procedure of Comparative Example I was repeated with the exception that Bridged Aluminum Phthalocyanine/Copper Phthalocyanine pigments manufactured by Eastman Kodak and BASF respectively replaced the magenta pigment. The resultant particles were spherical and particle size was 6.8μ.

COMPARATIVE EXAMPLE III

The procedure of Comparative Example I was repeated with the exception that the magenta pigment was replaced by Pigment Yellow 180 manufactured by BASF. The resultant particles were spherical and particle size was 6.4μ.

COMPARATIVE IV

The procedure of Comparative Example I was repeated with the exception that the magenta pigment was replaced by carbon black (REGAL 330) manufactured by CABOT. The resultant particles were completely spherical and particle size was 6.7μ.

EXAMPLE 1

To 14.8 g of the HOSTAPERM pink pigment media milled dispersion were then added 23.1 g of KAO C polyester binder and 45.5 g of ethyl acetate. This mixture was comprised of 7.0% pigment and 93.0% binder based on the total weight of pigment and binder and comprised the organic phase in the evaporative limited coalescence process. The organic phase was then mixed with an aqueous phase comprising 85 ml of pH4 buffer containing 0.0625 g of Aluminium Acetate (0.25%), 9.0 g of NALCO® 1060 colloidal silica and 1.96 ml of 10% poly (adipic acid-comethylaminoethanol). This mixture was then subjected to very high shear using a POLYTRON mixer sold by Brinkman followed by a MICROFLUIDIZER mixer. Upon exiting, the solvent was removed from the particles so formed by stirring overnight at room temperature in an open container. These particles were washed with 0.1N potassium hydroxide solution to remove the silica followed by water and dried. The toner particles were of the order of 5.8μ volume average and entirely non-spherical.

EXAMPLE 2

The procedure of Example 1 was repeated with the exception that 0.125 g of Aluminum Acetate (0.5%) was added. The resultant particles were completely non-spherical and particle size was 5.2μ.

EXAMPLE 3

The procedure of Example 1 was repeated with the exception that 0.25 g of Aluminum Acetate (1.0%) was added. The resultant particles were completely non-spherical and particle size was 6.0μ.

EXAMPLE 4

The procedure of Example 1 was repeated with the exception that magenta pigment was replaced with BrAlPc/CuPc cyan pigment and 0.0625 g of Aluminum Acetate (0.25%) added. The resultant particles were completely non-spherical and particle size was 5.9μ.

EXAMPLE 5

The procedure of Example 4 was repeated with the exception that 0.25 g of Aluminum Acetate (1.0%) was added. The resultant particles were completely non-spherical and particle size was 6.1μ.

EXAMPLE 6

The procedure of Example 1 was repeated with the exception that magenta pigment was replaced with Pigment Yellow 180 and 0.25 g of Aluminum Acetate (1.0%) added. The resultant particles were completely non-spherical and particle size was 5.3μ.

EXAMPLE 7

The procedure of Example 1 was repeated with the exception that magenta pigment was replaced with REGAL 330, carbon black and 0.25 g of Aluminum Acetate (1.0%) added. The resultant particles were completely non-spherical and particle size was 4.5μ.

EXAMPLE 8

The procedure of Example 1 was repeated with the exception that the pigment was omitted from the mixture and 0.25 g of Aluminum Acetate (1.0%) added. The resultant particles were completely non-spherical and particle size was 5.3μ.

EXAMPLE 9

To 14.8 g of the HOSTAPERM Pink pigment media milled dispersion were then added 23.1 g of KAO C polyester binder, 0.25 g of BONTRON E88 charge additive and 45.5 g of ethyl acetate. This mixture was comprised of 7.0% pigment and 93.0% binder based on the total weight of pigment and binder based on the total weight of pigment and binder and comprised the organic phase in the evaporative limited coalescence process. The organic phase was then mixed with an aqueous phase comprising 85 ml of pH4 buffer containing 0.25 g of Aluminum Acetate (1.0%), 9.0 g of NALCO® 1060 colloidal silica and 1.96 ml of 10% poly (adipic acid-comethylaminoethanol). This mixture was then subjected to very high shear using a POLYTRON sold by Brinkman followed by a MICROFLUIDIZER mixer. Upon exiting, the solvent was removed from the particles so formed by stirring overnight at room temperature in an open container. These particles were washed with 0.1N potassium hydroxide solution to remove the silica followed by water and dried. The toner particles were of the order of 6.2μ volume average and entirely non-spherical.

EXAMPLE 10

The procedure of Example 9 was repeated with the exception that magenta pigment was replaced with BrAlPc/CuPc cyan pigment. The resultant particles were completely non-spherical and particle size was 6.4μ.

EXAMPLE 11

The procedure of Example 9 was repeated with the exception that magenta pigment was replaced with Pigment Yellow 180. The resultant particles were completely non-spherical and particle size was 5.0μ.

EXAMPLE 12

The procedure of Example 9 was repeated with the exception that magenta pigment was replaced with REGAL 330, carbon black. The resultant particles were completely non-spherical and particle size was 3.7μ.

EXAMPLE 13

The procedure of Example 9 was repeated with the exception that the pigment was omitted from the mixture. The resultant particles were completely non-spherical and particle size was 5.0μ.

EXAMPLE 14

To 14.8 g of the HOSTAPERM Pink pigment media milled dispersion were then added 23.1 g of KAO C binder, 0.25 g of BONTRON E88 (manufactured by Orient Chemical Industries, Ltd.) and 45.5 g of ethyl acetate. This mixture was comprised of 7.0% pigment and 93.0% binder based on the total weight of pigment and binder and comprised the organic phase in the evaporative limited coalescence process. The organic phase was then mixed with an aqueous phase comprising 85 ml of pH4 buffer containing 0.25 g of Aluminum Acetylacetonate (1.0%), 9.0 g of NALCO® 1060 colloidal silica and 1.96 ml of 10% poly (adipic acid-comethylaminoethanol). This mixture was then subjected to very high shear using a POLYTRON sold by Brinkman followed by a MICROFLUIDIZER mixer. Upon exiting, the solvent was removed from the particles so formed by stirring overnight at room temperature in an open container. These particles were washed with 0.1N potassium hydroxide solution to remove the silica followed by water and dried. The toner particles were of the order of 5.3μ volume average and entirely non-spherical.

EXAMPLE 15

The procedure of Example 14 was repeated with the exception that Aluminum Acetylacetonate was replaced with Gallium Acetylacetonate. The resultant particles were completely non-spherical and particle size was 4.9μ.

TABLE 1

Specific Surface Area ($m^2/g$)

| Example | BET Value ($m^2/g$) |
|---|---|
| Comparative I | 0.83 |
| Comparative II | 0.93 |
| Comparative IV | 0.95 |
| Comparative III | 0.97 |
| Example 14 | 1.34 |
| Example 3 | 1.51 |
| Example 4 | 1.61 |
| Example 9 | 1.63 |
| Example 1 | 1.66 |
| Example 5 | 1.68 |
| Example 10 | 1.74 |
| Example 15 | 1.74 |
| Example 2 | 1.82 |
| Example 8 | 1.94 |
| Example 7 | 1.96 |
| Example 13 | 2.01 |
| Example 6 | 2.02 |
| Example 11 | 2.02 |
| Example 12 | 2.09 |

The BET results tabulated above support the present claim of controlling the toner morphology by the introduction of aluminium or gallium salts. BET value of approximately 1.00 $m^2/g$ denotes sphericity in the toner as is illustrated in comparative I, II, III and IV. BET values were calculated according to P. Chenebault and A. Schrenkamper, THE MEASUREMENT OF SMALL SURFACE AREAS BY THE B.E.T. ADSORPTION METHOD, The Journal of Physical Chemistry, Volume 69, Number 7, July 1965, pages 2300–2305.

The invention has been described in detail with particular reference to certain preferred embodiments thereof, but it will be understood that variations and modifications can be effected within the spirit and scope of the invention.

What is claimed is:

1. A method for the preparation of electrostatographic toner comprising the steps of:

a) dissolving a polymer material in an organic solvent to form an organic phase;

b) dispersing the organic phase in an aqueous phase comprising a salt selected from the group consisting of aluminum salt and gallium salt and a particulate stabilizer to form a dispersion and homogenizing the resultant dispersion;

c) evaporating the organic solvent and recovering a resultant product; and d) washing and drying the resultant product.

2. The method of claim 1 wherein a charge control agent is added in step a).

3. The method of claim 1 wherein a pigment is added in step a).

4. The method of claim 3 wherein the pigment to salt ratio by weight ranges from 1.0:0.5 to 1.0:0.06.

5. The method of claim 1 wherein a promoter is added in the dispersing step in b).

6. The method of claim 1 wherein the solvent is selected from the group consisting of chloromethane, dichloromethane, ethyl acetate, n-propyl acetate, iso-propyl acetate, vinyl chloride, methyl ethyl ketone, trichloromethane, carbon tetrachloride, ethylene chloride, trichloroethane, toluene, xylene, cyclohexanone and 2-nitropropane.

7. The method of claim 1 wherein the amount of particulate stabilizer is between 1 to 15 parts, by weight, based on 100 parts of total solids in the toner.

8. The method of claim 1 wherein the ratio of the aqueous phase to the organic phase, by volume, ranges from 1:1 to 9:1.

9. The method of claim 1 wherein the organic phase contains lubricants.

10. The method of claim 1 wherein the organic phase contains waxes.

11. The method of claim 1 wherein the polymer material is a homopolymer or copolymer.

12. The method of claim 11 wherein the homopolymer or copolymer is selected from the group consisting of polyethylene, polypropylene, polyisobutylene, polyisopentylene, polytrifluoroolefins, polyamides, acrylic resins, ethylene-methylacrylate copolymers, ethylene-ethyl acrylate copolymers, ethylene-ethyl methacrylate copolymers, polystyrene and copolymers of styrene with unsaturated monomers, polyesters, polyvinyl resins and ethylene-allyl alcohol copolymers.

13. The method of claim 11 wherein the homopolymer or copolymer is selected from the group consisting of polytetrafluoroethylene, polytrifluorochloroethylene, polyhexamethylene adipamide, polyhexamethylene sebacamide, polycaprolactam, polymethylmethacrylate, polymethylacrylate, polyethylmethacrylate and styrene-methylmethacrylate.

14. The method of claim 1 wherein the polymer material is polyester.

15. The method of claim 1 wherein the polymer material is butyl acrylate-styrene copolymer.

* * * * *